United States Patent
Franz et al.

(12)

(10) Patent No.: US 6,722,808 B1
(45) Date of Patent: *Apr. 20, 2004

(54) LINKING DEVICE FOR COMPONENTS, ESPECIALLY FOR HOUSING PARTS OF AUTOMATIC CUTOUTS

(75) Inventors: Bernhard Franz, Regensburg (DE); Wolfgang Leitl, Wenzenbach (DE); Josef Schmid, Kallmuenz (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/009,755

(22) PCT Filed: Apr. 17, 2000

(86) PCT No.: PCT/DE00/01201

§ 371 (c)(1),
(2), (4) Date: Oct. 29, 2001

(87) PCT Pub. No.: WO00/67277

PCT Pub. Date: Nov. 9, 2000

(30) Foreign Application Priority Data

Apr. 29, 1999 (DE) .......................................... 199 19 540

(51) Int. Cl.⁷ .................................................. F16B 5/06

(52) U.S. Cl. ..................... 403/282; 403/408.1; 403/291

(58) Field of Search ................................ 403/220, 225, 403/227, 279, 282, 291, 373, 374.2, 408.1; 52/285.1

(56) References Cited

U.S. PATENT DOCUMENTS 2,839,808 A * 6/1958 Zahodiakin

FOREIGN PATENT DOCUMENTS

| CH | 690 455 | 4/1940 |
|---|---|---|
| DE | 1 122 219 | 3/1961 |
| DE | 83 22 594 | 1/1984 |
| DE | 33 28 307 A1 | 2/1985 |
| DE | 44 20 766 A1 | 12/1995 |
| FR | 1 590 867 | 5/1970 |
| FR | 2 576 140 | 7/1986 |

* cited by examiner

Primary Examiner—Gregory J. Binda
Assistant Examiner—Ryan M. Flandro
(74) Attorney, Agent, or Firm—Harness, Dickey & Pierce, P.L.C.

(57) ABSTRACT

A connecting apparatus is provided for connecting a number of components, in particular for connecting the enclosure parts of circuit breakers. The connection apparatus includes a connecting element which has a shaft, which passes through through-openings which are aligned with one another in the connection, having an insertion end and having a holding end opposite it. In order to achieve a turning or twisting distance which is as short as possible when the connecting element is twisted in order to brace the components while avoiding weakening of the material, the connecting element includes two fixing lugs at the insertion end. These lugs are bent in the form of a circular arc in an initial state and are bent out radially in the mounting state. Alternatively, two fixing lugs which extend like a fork in the shaft longitudinal direction in an initial state and which are bent out radially in the mounting state are provided at the insertion end of the connecting element.

22 Claims, 8 Drawing Sheets

LINKING DEVICE FOR COMPONENTS, ESPECIALLY FOR HOUSING PARTS OF AUTOMATIC CUTOUTS

This application is the national phase under 35 U.S.C. §371 of PCT International Application No. PCT/DE00/01201 which has an International filing date of Apr. 17, 2000, which designated the United States of America, the entire contents of which are hereby incorporated by reference.

FIELD OF THE INVENTION

The invention generally relates to a connecting apparatus for a number of components. More preferably, it relates to a connecting apparatus including a connecting element which has a shaft which passes through through-openings which are aligned with one another in the connection, the connection element including an insertion end and including a holding end opposite it. More preferably, the components can be braced with respect to one another by twisting the connecting element. In this case, the term components preferably refers, in particular, to enclosure parts or shells of switching devices which are installed in a row or low-voltage switching devices, for example of circuit breakers.

BACKGROUND OF THE INVENTION

Circuit breakers and other devices which are installed in a row, as well as enclosure parts or halves thereof, are normally connected via one or more poles by nuts and bolts, clips or brackets, or rivets, with one enclosure shell and one cover shell having to be connected to one another for each pole. It is intended to be possible firstly to produce such connections cost-effectively and simply, and such that they can be installed easily. Secondly, compression loads which occur as a consequence of arching influences are intended to be absorbed by the connections, and tolerances are intended to be compensated for, while allowing the enclosure shells to expand and ring when subjected to environmental conditions. A specific prestressing force is also intended to be exerted on the enclosure shells in order not only to ensure that the parts to be connected are protected against twisting, but also to ensure that the connection is protected against being inadvertently loosened.

While the use of a screw connection for connecting the components or enclosure shells to one another is, firstly, costly and; secondly, the screw connection must be secured against inadvertently becoming loose, for example by means of varnish, a riveted joint offers only a small amount of compensation for tolerances in its longitudinal direction.

This is particularly true when the tolerances to be compensated for are additive. Furthermore, riveted joints easily bend when carrying out a riveting process using relatively long rivets. In addition, additional centering pieces have frequently been used in the past to protect the individual poles against twisting, even though this results in additional manufacturing and production costs.

At least two clips or brackets must be used, in a likewise costly manner, for a clip or bracket joint, which is likewise frequently used. In this case, the poles are firstly braced with respect to one another with only a small clamping force while; secondly, the clips or brackets can easily become loose, resulting in the risk of manipulation. A bonded joint, which has likewise been used in the past, does not allow the individual components to be dismantled without destroying them. Furthermore, it does not ensure that the components are adequately braced with respect to one another.

A connecting element which is manufactured from a flat strip material is known from German Utility Model DE 83 22 594 A1, and this can also be used for circuit breakers having an elongated shaft, whose two shaft ends are T-shaped by integrally formed tabs. In order to insert the known connecting elements into the mutually aligned through-openings or holes in the components to be connected, one of the shaft ends is slotted such that the T-shaped holding or fixing tabs can be interlaced in the direction of the shaft longitudinal axis. This admittedly results in this shaft end being matched to the shaft width. However, this configuration necessarily leads to the cross section of the shaft, and hence the connecting element, being weakened, with the consequence that the cross section must be deliberately weakened over the entire shaft length by equidistant holes. Admittedly, it makes it possible to achieve a uniform material load and to avoid any weak point. However, this weakening of the cross section leads to a considerable reduction in the shaft cross section that can be loaded and hence to a reduction in the bracing force which is intended to be achieved by twisting the shaft, resulting in the length of the connecting element being reduced. Furthermore, during the twisting process, the entire slot, which is lengthened by an elongated hole, must be covered by using a tool at the corresponding shaft end, and the opposite shaft end must be held in order firstly to secure this shaft end against rotation at the same time and; secondly, in order to achieve a tensile force, and hence a bracing force, which is as uniform as possible at the shaft ends. Furthermore, the complicated bending-in and bending-out mechanism with the slotted shaft end indicates that a number of twisting operations are required in order to ensure that the length of the connecting element is reduced sufficiently to brace the components.

SUMMARY OF THE INVENTION

The invention is thus based on an object of specifying a connecting apparatus of the type mentioned initially in which the disadvantages are avoided.

According to the invention, this object is achieved by the features of claim 1, for example. Alternatively, this object is achieved according to the invention by the features of claim 2, for example. For this purpose, the connecting element includes, at the insertion end, two fixing lugs which are bent in the form of a circular arc in an initial state and are bent out radially in the mounting state. Alternatively, two fixing lugs are provided at the insertion end of the connecting element, which extend like a fork in the shaft longitudinal direction in an initial state, and are bent out radially in the mounting state.

In both alternatives, in the mounting state before twisting of the connecting element, which is preferably manufactured by stamping from flat strip material, this shaft end, which is also used as the insertion end, is expediently inserted in a positively locking manner in a mounting depression, which is associated with the insertion end and opens into the corresponding through-opening.

In the first alternative, the insertion end opposite the holding end is initially expediently designed in a T-shape in the final state. Subsequently, it can then be changed to the initial state, with the fixing lugs bent inward in a circular shape, by using a bending process to match it to the external dimensions of the shaft. In the mounting state, that is to say after insertion of the connecting element into the through-openings, the fixing lugs are then bent out radially.

In order to allow the insertion end of the fixing lugs to be bent outside the component or enclosure part facing this end, a mounting depression which holds the opposite holding end of the connecting element is designed in two steps. The stepped internal contour is expediently formed by two notches which run at an angle to one another, preferably at right angles to one another, have a different notch depth, and define two different holding positions.

When the holding end of the connecting element is being fixed in position, the insertion end, which is provided with the fixing lugs, projects out of the mounting depression associated with said insertion end in a first comparatively deep position within the mounting depression which holds the holding end, and projects beyond the component or enclosure arrangement, so that the fixing lugs can be bent out radially in a simple manner. Following this bending process, the connecting element is pulled back and is fixed in a second position, which is displaced or offset axially outward with respect to the first position. In this case, the insertion end is at the same time pulled completely into this mounting depression that is associated with it.

The desired bracing force to brace the components or enclosure parts to one another is then produced by twisting the shaft of the connecting element. This is done by attaching an appropriate twisting tool to the insertion end, which is provided with the bent-out fixing lugs.

This embodiment is particularly suitable for connecting multipole circuit breakers having a corresponding number of enclosure and cover shells.

In the second alternative, in which the insertion end of the connecting element is designed like a fork, the two fixing lugs which extend in the shaft longitudinal direction in an initial state are integrally formed on the shaft end in such a manner that they form a direct, straight-line extension of the shaft, without any projection at the sides. In the mounting state, these fixing lugs, which are preferably formed by a stamped-out region at the insertion end and run parallel to one another, are bent out radially. In this case, the outward bend can be produced both in the shaft plane and transversely with respect to it.

In this embodiment, the connecting element is once again twisted by bending the fixing lugs out once the positive lock has been produced. In this case, the positive lock in the mounting state likewise indicates that the number of turns that need to be made when twisting the shaft is particularly low, and, in particular, is just one turn.

In one advantageous embodiment, a mounting depression which holds the holding end of the connecting element and is aligned with the through-openings is designed as a centering cone, with the holding end itself being formed conically in order to form a mating surface corresponding to the centering cone. This allows reliable self-centering of the connecting element within the mutually aligned through-holes in the components. At the same time, when the connecting element is twisted, a tensile force which is uniform over its cross-section is exerted on the opposite shaft end. Furthermore a friction force which is sufficient to prevent the holding end from being rotated at the same time is advantageously produced on the basis of the comparatively large mutually corresponding mating surfaces of the centering cone on the one hand and of the centering cone at the holding end on the other hand. There is thus no need for the two shaft ends of the connecting element to be held firmly.

The advantages achieved by the invention are, in particular, that, insertion of a connecting element which is expediently in the form of a flat strip and has fixing lugs which, in the initial state, are either bent in a circular shape or extend without any radial projection beyond the shaft external dimensions in the shaft longitudinal direction indicates that it is particularly simple to insert the connecting element into mutually aligned through-openings in components which are to be connected to one another. Furthermore, the components can be braced to one another by twisting the connecting element through one and a half turns or one turn (½ times or once) without weakening the material.

The connecting element provided for this purpose is, firstly, particularly simple and, secondly, is particularly robust since the material cross section is not weakened, that is to say in particular the shaft has no holes or slots. The connection can also be made in situ in a particularly simple manner. When using galvanized steel strip or stainless material, this furthermore results in reliable corrosion protection. One major advantage is that it is possible to use already existing rivet holes or bolt holes in the enclosure parts.

Since the positive lock, at the insertion end of the shaft, is actually produced in the mounting state and before the turning or twisting of the connecting element by bending the fixing lugs radially outward or over, the reduction in the length of the connecting element required to apply the necessary bracing force. Hence, the required torsional movement, are particularly short and, in particular, are considerably shorter than in the case-of the cited prior art according to DE 83 22 594 U1.

The formation of a centering cone in the mounting depression which holds a correspondingly conical holding end of the connecting element furthermore results, firstly, in centering and; secondly, in a high friction force, so that a particularly high clamping force with simple handling at the same time is achieved when bracing the components. Furthermore, a particularly small turning or twisting distance is achieved when twisting the connecting element in order to brace the components, with self-centering at the same time. Only one connecting part is required in this case, even for multipole devices with a corresponding number of enclosure parts or shelves for each such connecting point.

BRIEF DESCRIPTION OF THE DRAWINGS

Exemplary embodiments of the invention will be explained in more detail in the following text with reference to a drawing, in which.

Mutually corresponding parts are provided with the same reference symbols in all the figures.

DETAILED DESCRIPTION OF THE PREFERRED EMBODIMENTS

Figure 1:
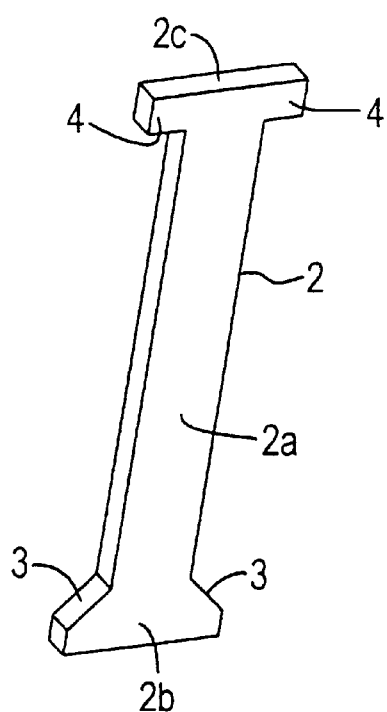
FIG. 1 shows a perspective illustration of an I-shaped connecting element in the form of a flat strip.

FIG. 1 shows an I-shaped connecting element 2, stamped from a flat strip material, having an elongated shaft 2a, whose shaft ends 2b and 2c are extended outward in an approximately T-shaped manner. In this case, the shaft end 2b, which is referred to as the holding end in the following text, is conical, with the cone facing toward the shaft 2a, for forming mating surfaces 3. The opposite shaft end 2c, which is referred to as in the insertion end in the following text, has two fixing lugs or elements 6 which point radially outward.

In a connecting apparatus 1 as shown in FIGS. 3 to 6 as well as 9 and 11, the connecting element 2 is used for connecting an enclosure shell 5 and a cover shell 6, for example of a circuit breaker. The components or enclosure parts 5, 6 are provided with mutually aligned through-openings 7 and 8, respectively, into which a respective mounting depression 9 or 10 opens. The first mounting depression 10, which is associated with the cover shell 6 in the exemplary embodiment, is provided with a centering cone 11, which corresponds to the mating surfaces 5 on the conical holding end 2b of the connecting element 2, and whose internal diameter tapers to the internal diameter of the through-holes 7, 8.

Figure 2:
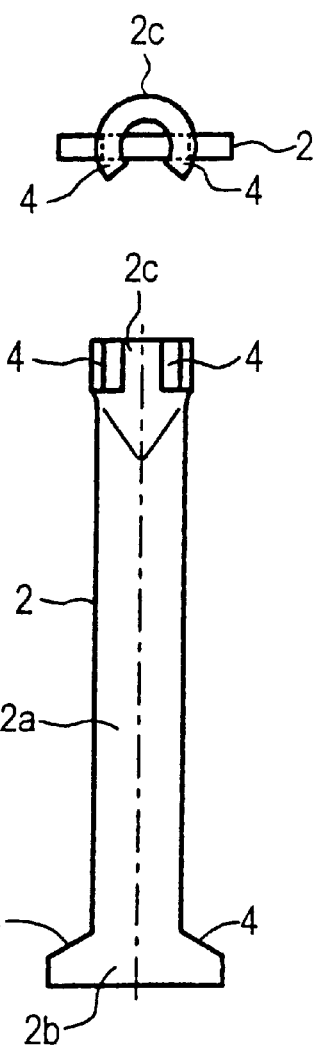
FIG. 2 shows a plan view (upper half of the figure) and a side view (lower half of the figure) of a connecting element as shown in FIG. 1, with fixing lugs, bent in a circular shape, at the insertion end, FIGS. 3 to 6 each show, in the form of a plan view (upper half of the figure) and in the form of a longitudinal section (lower half of the figure), the connecting area of two enclosure parts with the connecting element as shown in FIG. 2, in different mounting states, with FIGS. 5 and 6 showing a longitudinal section offset through 90° with respect to FIGS. 3 and 4.
Figure 3:
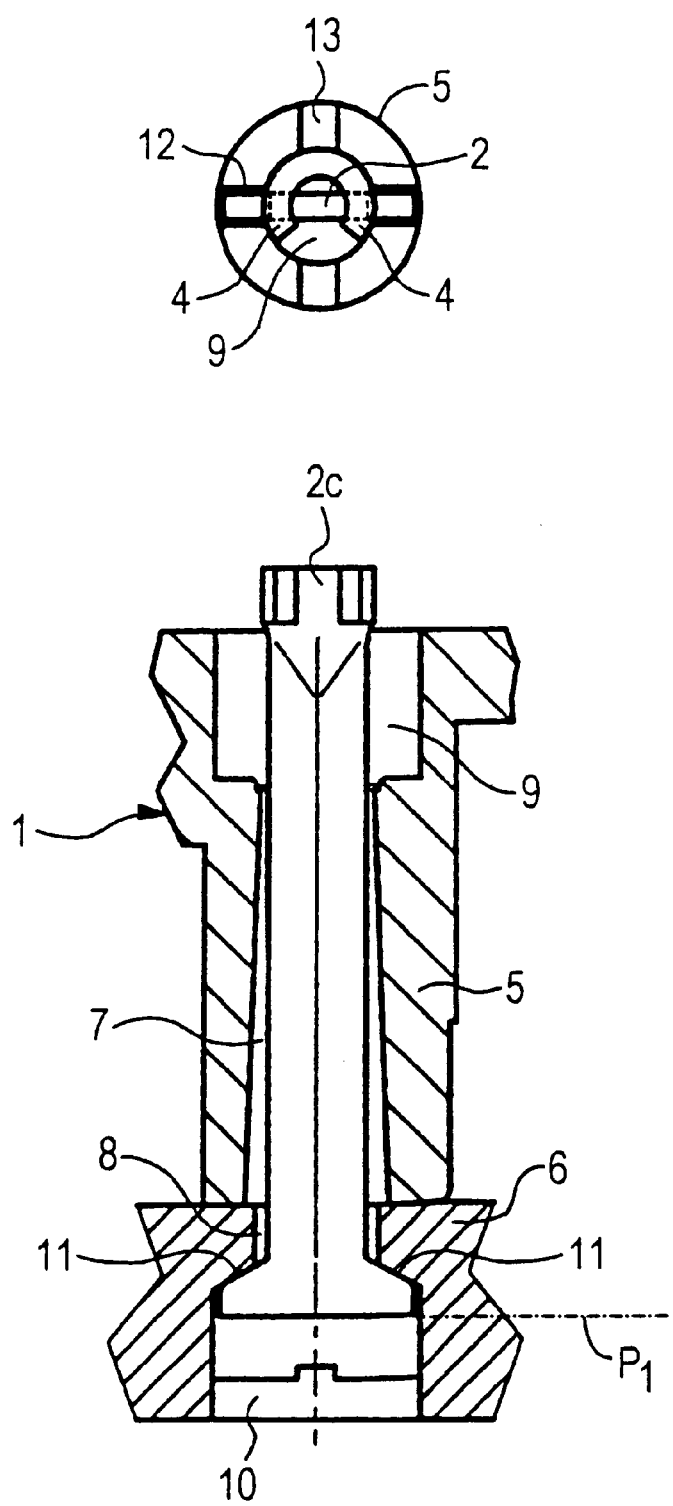

In the initial state illustrated in FIG. 2, the fixing lugs 4 of the connecting element 2 are reduced, starting from its shape as shown in FIG. 1 at the insertion end 2c opposite the holding end 2b, by use of a bending process to the external size of the shaft 2a, by the two fixing lugs 4 being bent in the form of a circle or circular arc. In this initial state, the connecting element 2 can be pushed through the mutually aligned through-holes 7, 8 in the enclosure parts 5 and 6, respectively. This mounting state is shown in FIG. 3 in the form of a longitudinal section (lower half of the figure) and in a plan view of the insertion end 2c (upper half of the figure). In this mounting state, the holding end 2b of the connecting element 1 is located in a first, comparatively deep, position $P_1$ within the mounting depression 10. The mounting depression 10 is appropriately stepped for this purpose, with two depressions or notches 12, 13, which run radially and at right angles to one another, being provided to form the steps. This can be seen in the upper half of FIG. 3.

Figure 4:
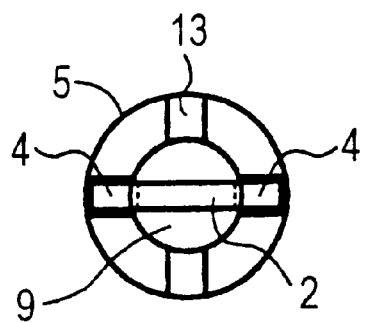
Figure 4:
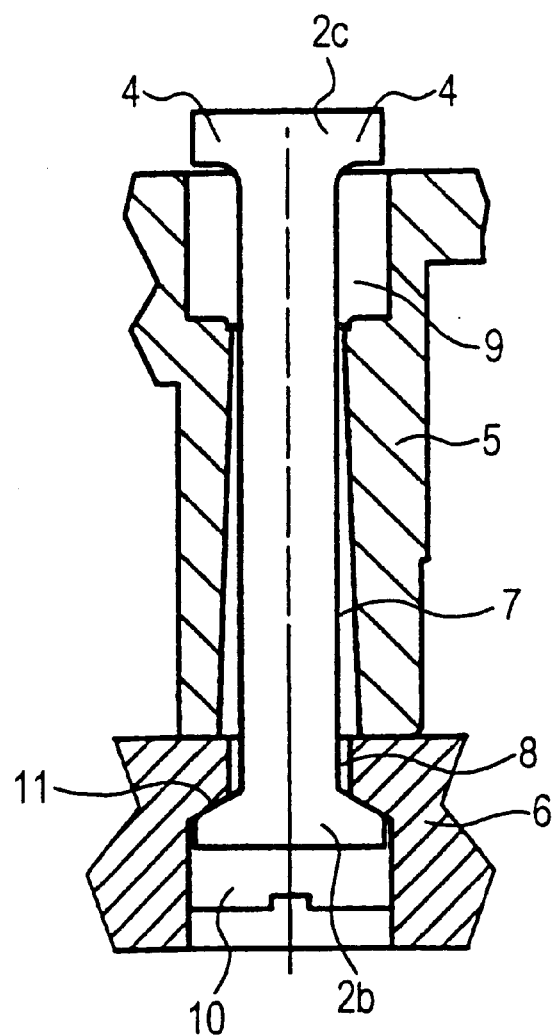
Figure 5:
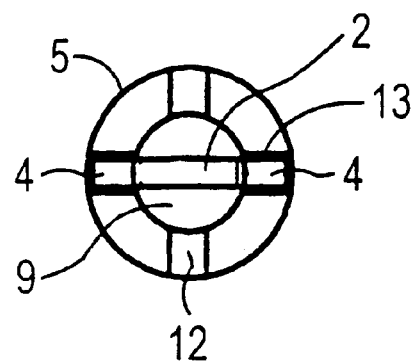
Figure 5:
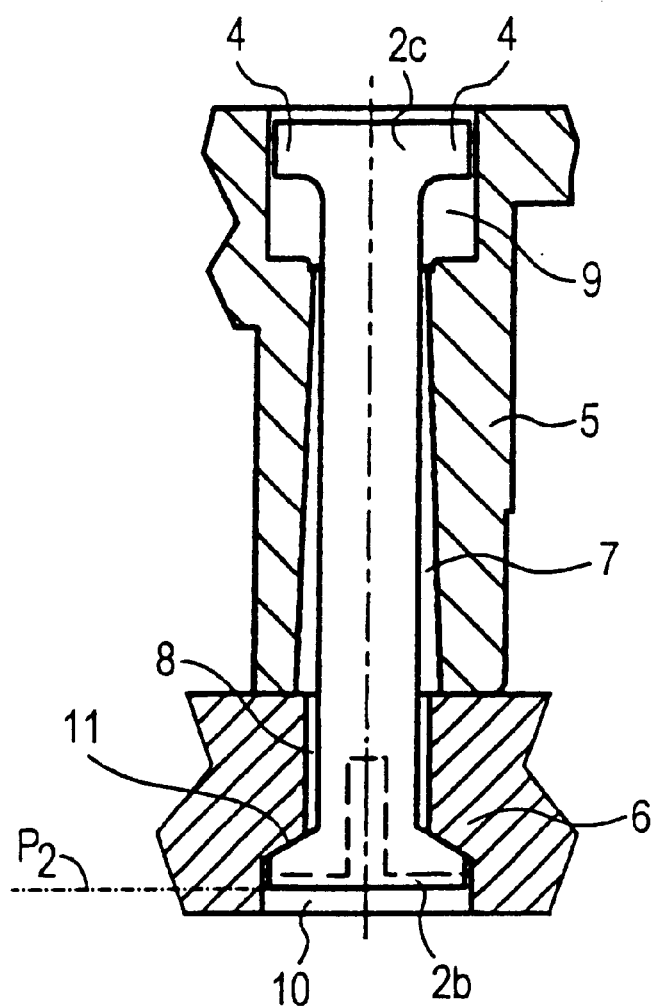

In a next mounting step, as shown in FIG. 4, the two fixing lugs 4 at the insertion end 2c of the connecting element 2 are bent radially outward, in which case the bending-out process can be carried out outside the enclosure part 5, since the conical holding end 2b is in a deep position $P_1$. In a subsequent mounting step as shown in FIG. 5, the connecting element 2 is twisted through about 90° with respect to the position shown in FIGS. 3 and 4, with the conical holding end 2b being fixed in a second position $P_2$, which is offset axially outward. In this mounting state, both shaft ends 2b and 2c are completely inserted within the mounting depressions 9 and 10 respectively associated with them. In this case, the mating surfaces 3 on the conical holding end 2b are already located on the corresponding conical surfaces of the centering cone 11 within the mounting depression 10.

Figure 6:
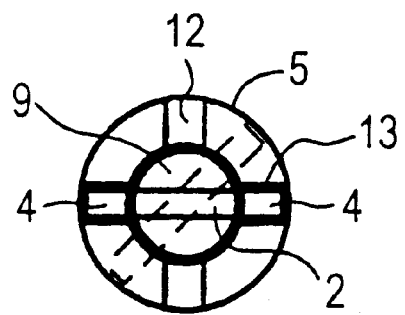
Figure 6:
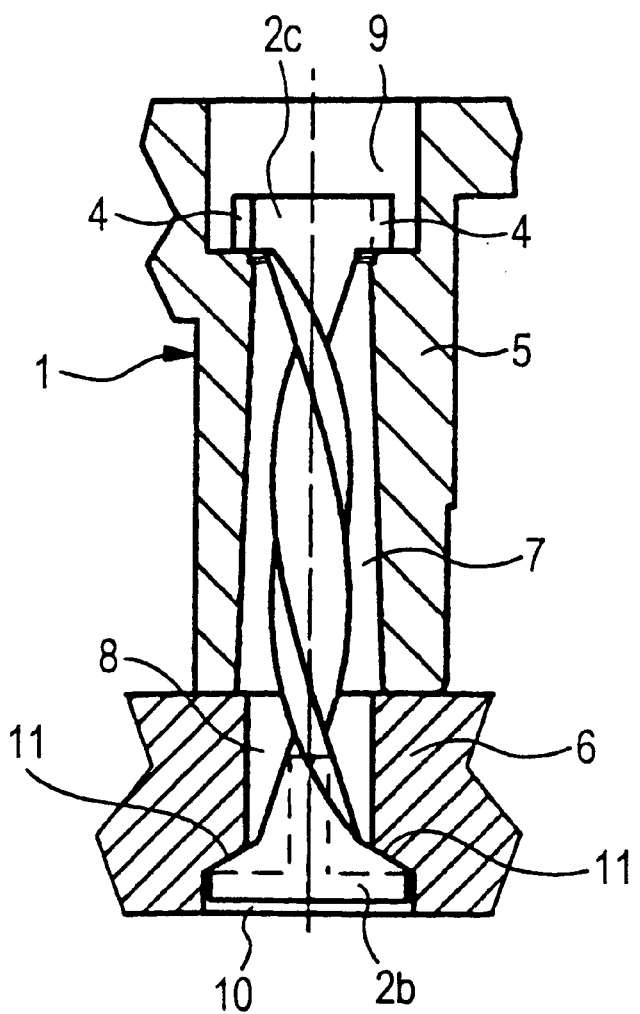

In a final mounting step, the shaft 2a of the connecting element 2 is twisted. This is done by using an appropriate tool (not illustrated) to act only on the insertion end 2c in order to twist the connecting element 2, during which process the opposite holding end 2b need not be held firmly owing to the friction fit between the mating surface 3 of the conical holding end 2b and the opposite surface, which corresponds with it, on the centering cone 11. This state, in which the two enclosure parts 5 and 6 are braced with respect to one another, is illustrated in FIG. 6. It can also be seen from this figure that only a single twisting turn, that is to say a 360° rotation of the insertion end 2c, is required to brace the enclosure parts 5, 6.

Figure 7:
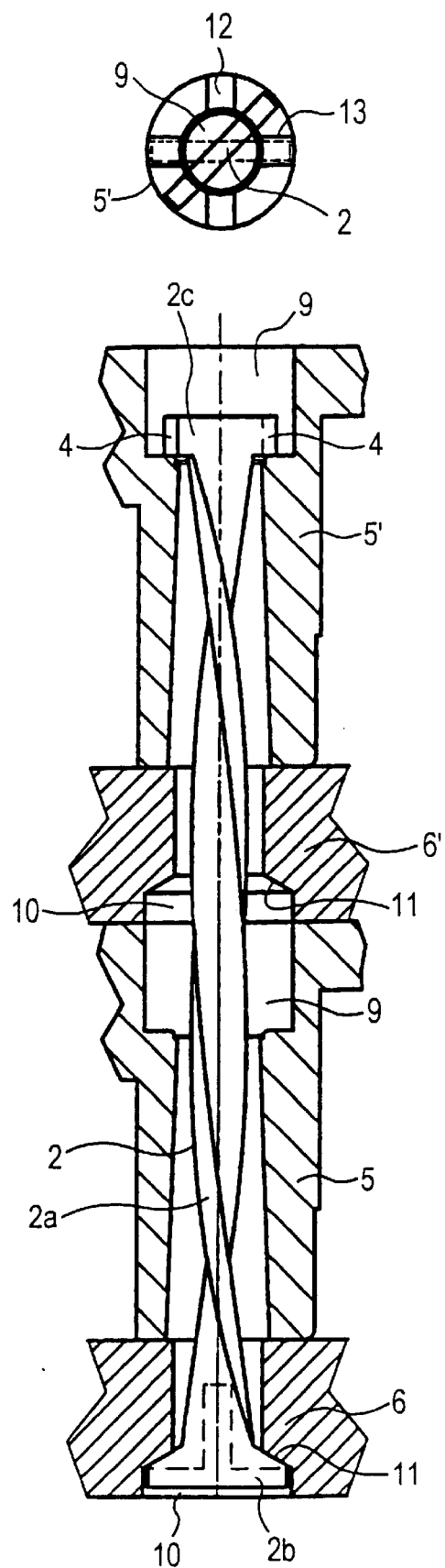
FIG. 7 shows an illustration, as shown in FIG. 6, of the connection of a two-pole device.

FIG. 7 shows a corresponding embodiment of the connection of a two-pole appliance with enclosure parts 5, 6 and 5', 6' located one above the other, illustrated as shown in FIG. 6. The connecting element 2 is approximately twice as long as the connecting element 2 for a single-pole enclosure, compared to the embodiment shown in FIGS. 3 to 6.

Figure 8:
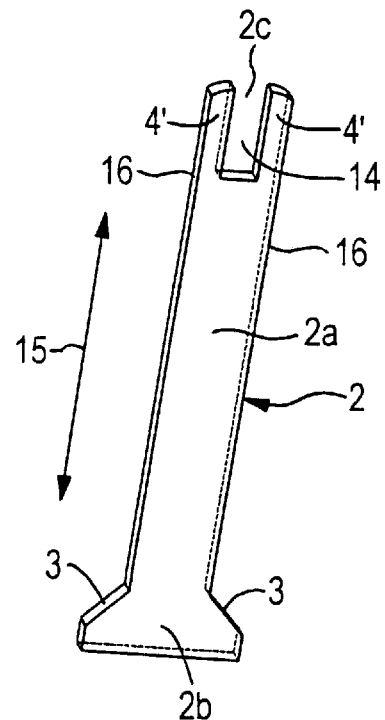
FIG. 8 shows a perspective illustration of an alternative embodiment of the connecting element with a fork-like insertion end.
Figure 9:
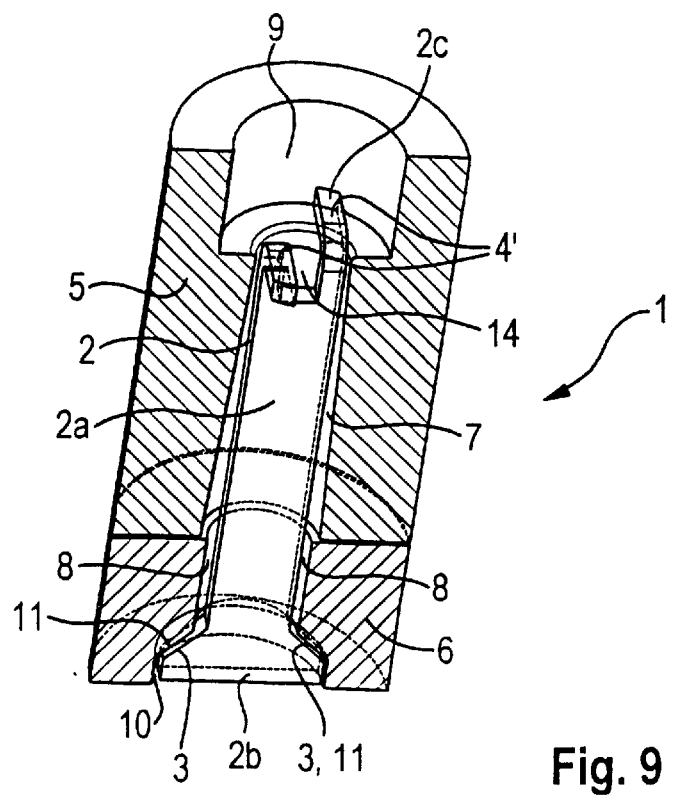
FIG. 9 shows a perspective illustration of the connecting apparatus with the connecting element as shown in FIG. 8.

FIG. 8 shows a further embodiment of the connecting element 2, whose mounting state is shown in FIG. 9. In this embodiment, the connecting element 2 is designed in the form of a fork at its insertion end 2c, and is provided with two fixing lugs 4', which extend in the shaft longitudinal direction 15 forming a rectangular slot 14. These fixing lugs 4' which extend like fingers parallel to one another in the shaft longitudinal direction 15, effectively form a direct extension of the shaft 2a, without the fixing lugs 4' projecting beyond the extent of the shaft 2a at the sides. In other words, the side outer edges 16 of the shaft 2a are directly aligned in the direction of the insertion end 2c with the side outer edges of the fixing lugs 4'.

Once the connecting element 2 has been inserted through the mutually aligned through-holes 7, 8 in the respective enclosure parts 5 and 6 to be braced, the mating surfaces 3 of the conical holding end 2b once again form a friction fit on the corresponding opposite surface of the centering cone 11 within the mounting depression 10. The connecting element 2 is thus once again centered within the through-openings 7, 8. Bending the two fixing lugs 4' around in the opposite direction and transversely with respect to the plane of the shaft 2a itself results in the connecting element 2 being fixed in position in a positively locking manner within the mutually aligned through-holes 7, 8. The desired pulling-in force or bracing force is achieved by twisting the shaft 2a by use of the tool, which once again acts on only one end.

Figure 10:
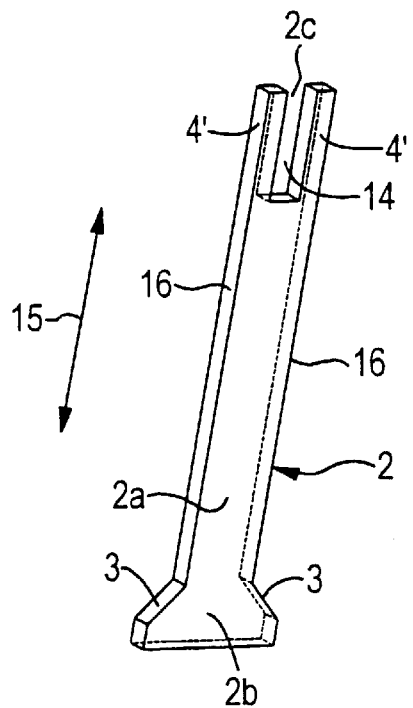
FIG. 10 shows a modified embodiment of the connecting element as shown in FIG. 8.
Figure 11:
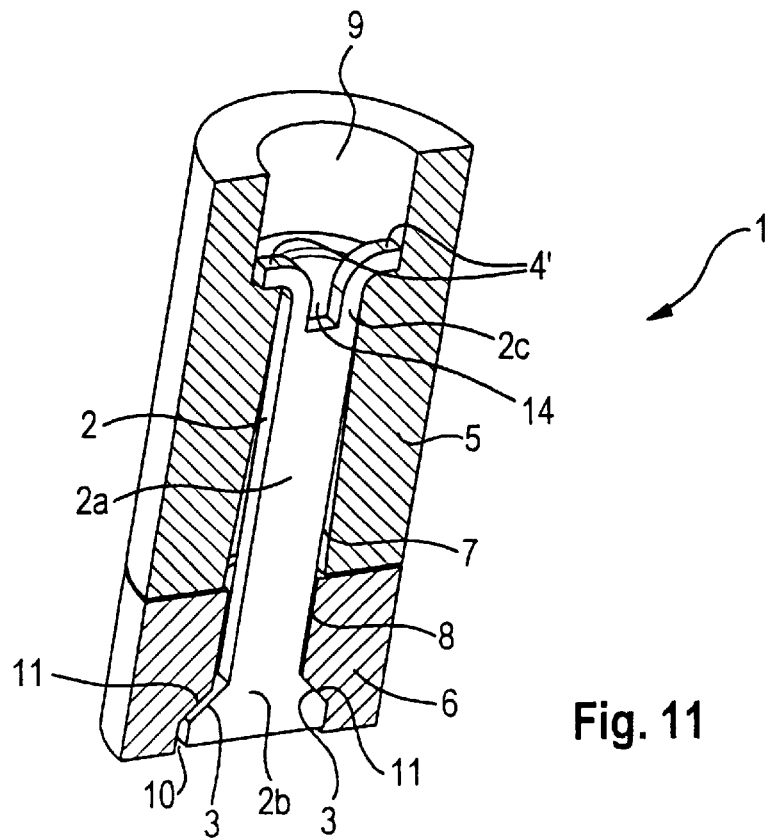
FIG. 11 shows an illustration according to FIG. 9 of a connecting apparatus, using the connecting element as shown in FIG. 10.

An alternative connecting apparatus 1 is shown in FIG. 11, in which the two fixing lugs 4', in contrast to the embodiment shown in FIG. 9, are bent radially outward in the opposite direction in the plane of the shaft 2a. A connecting element 2 which is preferably used for this purpose is designed, as shown in FIG. 10, with flat ends on the fixing lugs 4', while these are rounded outward in the connecting element 2 shown in FIG. 8. A positive lock is once again produced here, with the necessary bracing force once again being produced by twisting at the opposite holding end 2b.

In comparison to the variant shown in FIG. 11, the connecting apparatus 1 as shown in FIG. 9 has the advantage that the fixing lugs 4' have a larger contact surface area. Furthermore, this results in a connection with particularly high elasticity. In addition, the connections as shown in FIGS. 9 and 11 are detachable, since rotation of the holding end 2b further results in the fixing lugs 4' being bent inward until the connecting element 2 can be pulled out of the through-holes 7, 8.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A connecting apparatus for at least two components, comprising:
a connecting element including a shaft which passes through through-openings aligned with one another, and including an insertion end and a holding end opposite thereto, wherein twisting the connecting element braces the components with respect to one another, and wherein, at the insertion end, the connecting element includes at least two fixing lugs, bent in the form of a circular arc in an initial state and bent out radially in a mounting state.

2. The connecting apparatus as claimed in claim 1, further comprising:
a mounting depression, which holds the holding end and which is aligned with the through-openings, including a stepped internal contour which, as a consequence of the connecting element being twisted, holds the holding end within the mounting opening in a second position, which is axially offset with respect to a first position.

3. The connecting apparatus as claimed in claim 2, wherein the stepped internal contour includes two notches which run at an angle to one another.

4. The connecting apparatus as claimed in claim 3, wherein the two notches run at right angles.

5. The connecting apparatus as claimed in claim 3, further comprising:
a first mounting depression, which holds the holding end and is aligned with the through-openings, including a centering cone, wherein the holding end is conical, forming a mating surface which corresponds with the centering cone.

6. The connecting apparatus as claimed in claim 2, further comprising:
a first mounting depression, which holds the holding end and is aligned with the through-openings, including a centering cone, wherein the holding end is conical, forming a mating surface which corresponds with the centering cone.

7. The connecting apparatus as claimed in claim 1, further comprising:
a first mounting depression, which holds the holding end and is aligned with the through-openings, including a centering cone, wherein the holding end is conical, forming a mating surface which corresponds with the centering cone.

8. The connecting apparatus as claimed in claim 1, wherein the connecting element includes a flat strip and has no weak point over the entire shaft length.

9. The connecting apparatus of claim 8, wherein the connecting element has no holes or slots.

10. The connection apparatus of claim 1, wherein the at least two components include enclosure parts of at least one circuit breaker.

11. A connecting apparatus for at least two components, comprising:
a connecting element including a shaft which passes through through-openings aligned with one another, and including an insertion end and a holding end opposite thereto, wherein twisting the connecting element braces the components with respect to one another, wherein in an initial state the connecting element is pushed through the through-openings, and wherein at least two fixing lugs are provided at the insertion end of the connecting element, the at least two fixing lugs extend like a fork in the initial state, wherein the free ends of the at least two fixing lugs extend in a longitudinal direction of the shaft and run parallel to one another in the initial state, and are bent out radially in a mounting state, so that the free ends of the at least two fixing lugs extend substantially perpendicular to the longitudinal direction of the shaft.

12. The connecting apparatus as claimed in claim 11, wherein the at least two fixing lugs extend like fingers in the shaft longitudinal direction, and form a direct extension of the side outer edges of the shaft, such that the side outer edges are aligned directly in the direction of the insertion end and merge into the fixing lugs without any projection.

13. The connecting apparatus as claimed in claim 12, wherein in the mounting state, the fixing lugs are bent out within the shaft plane or transversely with respect to the shaft plane of the connecting element.

14. The connecting apparatus as claimed in claim 13, wherein the two fixing lugs are bent out in opposite directions.

15. The connecting apparatus as claimed in claim 12, further comprising:
a first mounting depression, which holds the holding end and is aligned with the through-openings, including a centering cone, wherein the holding end is conical, forming a mating surface which corresponds with the centering cone.

16. The connecting apparatus as claimed in claim 11, wherein in the mounting state, the fixing lugs are bent out within the shaft plane or transversely with respect to the shaft plane of the connecting element.

17. The connecting apparatus as claimed in claim 16, wherein the two fixing lugs are bent out in opposite directions.

18. The connecting apparatus as claimed in claim 17, further comprising:
a first mounting depression, which holds the holding end and is aligned with the through-openings, including a centering cone, wherein the holding end is conical, forming a mating surface which corresponds with the centering cone.

19. The connecting apparatus as claimed in claim 16, further comprising:
a first mounting depression, which holds the holding end and is aligned with the through-openings, including a centering cone, wherein the holding end is conical, forming a mating surface which corresponds with the centering cone.

20. The connecting apparatus as claimed in of claim 11, further comprising:
a first mounting depression, which holds the holding end and is aligned with the through-openings, including a centering cone, wherein the holding end is conical, forming a mating surface which corresponds with the centering cone.

21. The connecting apparatus as claimed in claim 20, wherein the connecting element includes a flat strip and has no weak point over the entire shaft length.

22. The connection apparatus of claim 11, wherein the at least two components include enclosure parts of at least one circuit breaker.

* * * * *